US 8,248,257 B2

(12) United States Patent
Yu

(10) Patent No.: US 8,248,257 B2
(45) Date of Patent: Aug. 21, 2012

(54) SYSTEM AND METHOD FOR TESTING CHARGING CURRENT OF A MOBILE ELECTRONIC DEVICE

(75) Inventor: Yung-Chieh Yu, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 598 days.

(21) Appl. No.: 12/499,015

(22) Filed: Jul. 7, 2009

(65) Prior Publication Data
US 2010/0052927 A1 Mar. 4, 2010

(30) Foreign Application Priority Data
Aug. 29, 2008 (CN) .......................... 2008 1 0304309

(51) Int. Cl.
G08B 21/00 (2006.01)
(52) U.S. Cl. ................................ 340/636.13; 340/636.1
(58) Field of Classification Search ............... 340/636.1, 340/636.12, 636.13, 636.15, 636.2
See application file for complete search history.

(56) References Cited

U.S. PATENT DOCUMENTS

| | | | | |
|---|---|---|---|---|
| 5,406,254 A * | 4/1995 | Le Nay et al. | ................ | 340/501 |
| 5,519,383 A * | 5/1996 | De La Rosa | ............. | 340/636.15 |
| 7,542,858 B2 * | 6/2009 | Horning et al. | ................. | 702/63 |
| 7,764,066 B2 * | 7/2010 | Horning et al. | ............... | 324/426 |
| 2009/0128163 A1 * | 5/2009 | Horning et al. | ............... | 324/555 |

* cited by examiner

Primary Examiner — Travis Hunnings
(74) Attorney, Agent, or Firm — Altis Law Group, Inc.

(57) ABSTRACT

A system and method of testing charging current of a mobile electronic device sets a charging voltage value and a battery voltage value, and sends a control command to a power supply device to generate the charging voltage and the battery voltage. The system and method further receives a charging current value from a current test device under the charging voltage and the battery voltage. Furthermore, the system and method determine if the charging current value falls in an allowable current range and displays test result on a display device.

12 Claims, 2 Drawing Sheets

SYSTEM AND METHOD FOR TESTING CHARGING CURRENT OF A MOBILE ELECTRONIC DEVICE

BACKGROUND

1. Technical Field

Embodiments of the present disclosure are related to testing systems and methods, and particularly to a system and method for testing charging current of a mobile electronic device.

2. Description of Related Art

It is necessary to test mobile electronic devices for quality assurances. One such test of a mobile electronic device is to test charging current of the mobile electronic device when the mobile electronic device is being charged. Previously, a user often uses a battery to test the charging current of the mobile electronic device. However, the battery cannot provide constant voltage when the battery has been recharged many times. For example, if the mobile electronic device requires the charging voltage of 3.7 V, but the battery just provides the charging voltage of 3.6 V, then the test may be inaccurate.

Therefore, there is a need for a system and method to overcome the aforementioned problem.

DETAILED DESCRIPTION

All of the processes described below may be embodied in, and fully automated via, function modules executed by one or more general purpose processors of a mobile electronic device. Some or all of the methods may alternatively be embodied in specialized hardware. The function modules may be stored in any type of computer-readable medium or other computer storage device.

Figure 1:
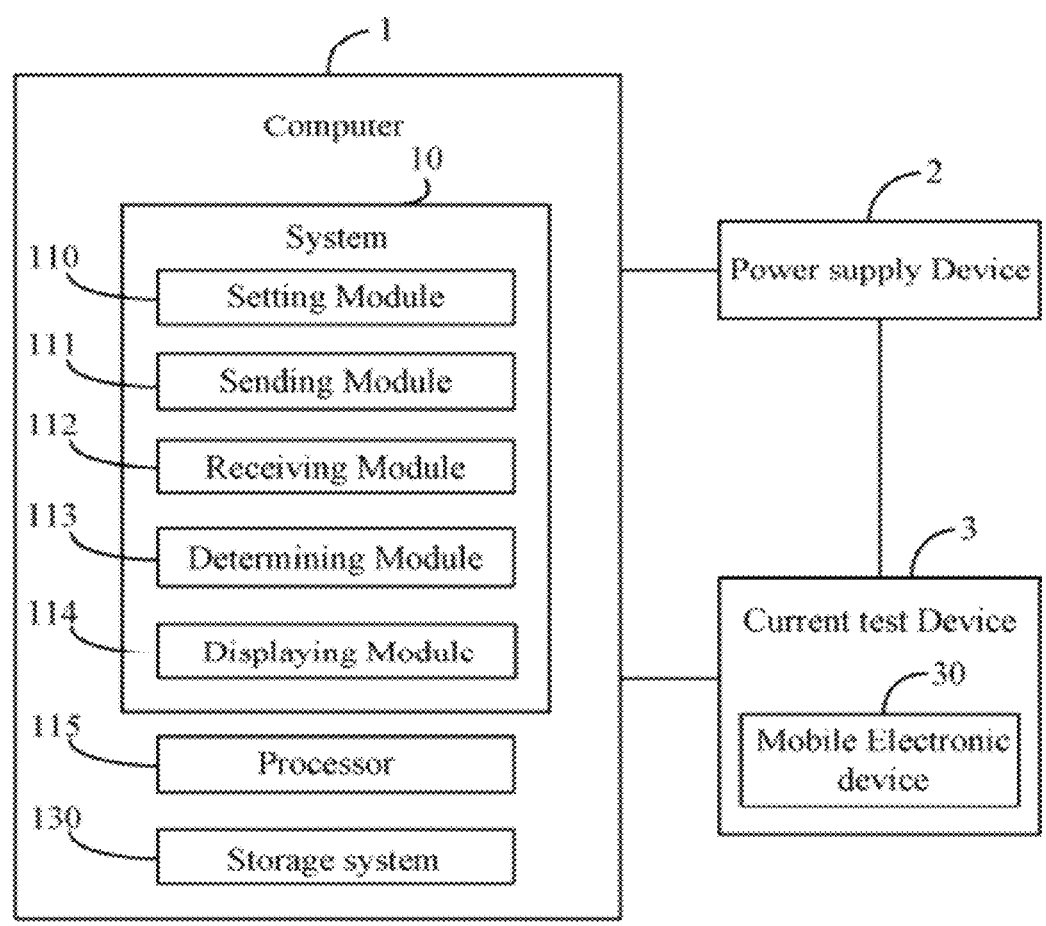
FIG. 1 is a block diagram of one embodiment of a system for testing charging current of a mobile electronic device.

FIG. 1 is a block diagram of one embodiment of a computer 1 comprising a system 10. The system 10 may be used to test charging current of a mobile electronic device 30. The computer 1 is connected to a power supply device 2 and a current test device 3. In one embodiment, the computer 1 may be a personal computer (PC), a network server, and can also be any other appropriate data-processing equipment. The computer 1 includes a display device to display test result. The power supply device 2 provides direct-current (DC) power to the current test device 3 and generates constant voltages. In one embodiment, the power supply device 2 generates two voltages, such as a charging voltage and a battery voltage. The power supply device 2 may be, but not limited to, an ammeter. The power supply device 2 is connected to the current test device 3. The current test device 3 measures a charging current of the mobile electronic device 30 when the mobile electronic device 30 is being charged under the charging voltage and the battery voltage. The mobile electronic device 30 is installed in the current test device 3. Depending on the embodiment, the mobile electronic device 30 may be a mobile phone, a personal digital assistant (PDA), a handheld game player, or a digital camera, among other portable electronic devices.

In one embodiment, the system 10 includes a setting module 110, a sending module 111, a receiving module 112, a determining module 113, and a displaying module 114. One or more computerized codes of the modules 110-114 are stored in the storage system 130. One or more general purpose or specialized processors, such as a processor 115 executes the computerized codes of the modules 110-114 to provide one or more operations of the system 10.

The setting module 110 is operable to set a charging voltage value and a battery voltage value. In one embodiment, the setting module 110 sets a charging voltage value and a battery voltage value according to a specification of the mobile electronic device 30. The specification of the mobile electronic device 30 includes the charging voltage and battery voltage value that the mobile electronic device 30 requires during charging. For example, if the charging voltage value required by the mobile electronic device 30 is 5.5 V, and the battery voltage value required by the mobile electronic device 30 is 3.7 V, then the setting module 110 sets the charging voltage value to be 5.5 V and the battery voltage value to be 3.7 V.

The sending module 111 is operable to send a control command to the power supply device 2 to generate the charging voltage and the battery voltage. In one embodiment, the power supply device 2 generates the charging voltage of 5.5 V and the battery voltage of 3.7 V according to the control command.

The receiving module 112 is operable to receive a charging current value of the mobile electronic device 30 from the current test device 3 under the charging voltage and the battery voltage generated by the power supply device 2. In one embodiment, the current test device 3 measures the charging current of the mobile electronic device 30, then the receiving module 112 receives the charging current value from the current test device 3.

The determining module 113 is operable to determine if the charging current value falls in an allowable current range. In one embodiment, the allowable current range is from 740 milli-amperes (mA) to 780 mA.

The displaying module 114 is operable to display test success or failure information on the display device of the computer 1. In one embodiment, the displaying module 114 displays the test success information on the display device, in response to a determination that the charging current value falls in the allowable current range. For example, if the charging current value is 750 mA, then the displaying module 114 displays "SUCCESS" on the display device. The displaying module 114 displays also the test failure information on the display device, in response to a determination that the charging current value does not fall in the allowable current range. For example, if the charging current value is 730 mA, then the displaying module 114 displays "FAIL" on the display device.

Figure 2:
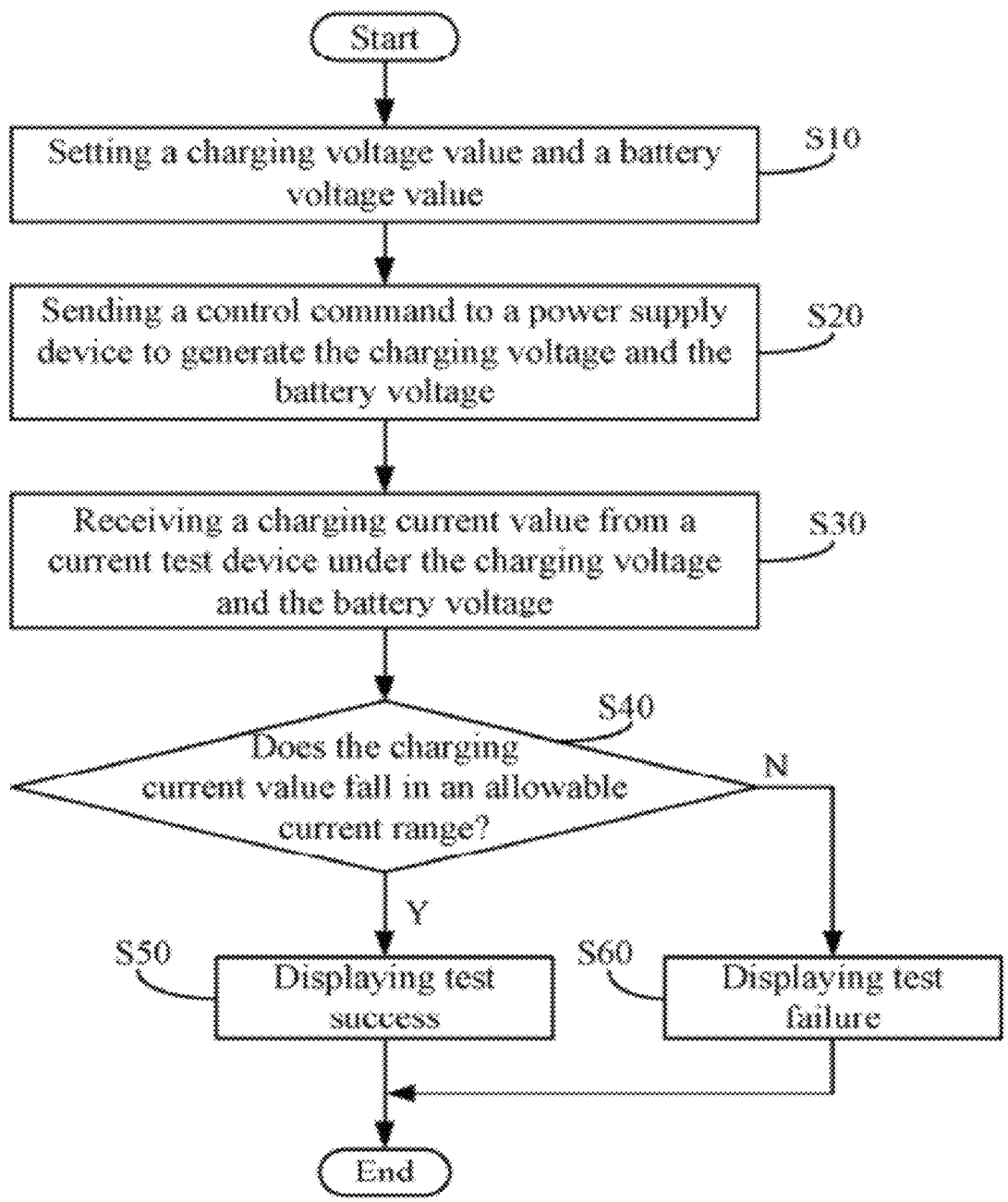
FIG. 2 is a flowchart of one embodiment of a method for testing charging current of the mobile electronic device.

FIG. 2 is a flowchart of one embodiment of a method for testing charging current of the mobile electronic device 30. Depending on the embodiment, additional blocks may be added, while others deleted, and the blocks may also be executed in a different order than described.

In block S10, the setting module 110 sets a charging voltage value and a battery voltage value. As mentioned above, the setting module 110 sets the charging voltage value to be 5.5 V and the battery voltage value to be 3.7 V.

In block S20, the sending module 111 sends a control command to a power supply device 2 to generate the charging voltage and the battery voltage. As mentioned above, the power supply device 2 generates the charging voltage of 5.5 V and the battery voltage of 3.7 V according to the control command.

In block S30, the receiving module 112 receives a charging current value of the mobile electronic device 30 from the current test device 3 under the charging voltage and the battery voltage generated by the power supply device 2. As mentioned above, the current test device 3 measures the charging current of the mobile electronic device 30, then the receiving module 112 receives the charging current value from the current test device 3.

In block S40, the determining module 113 determines if the charging current value falls in an allowable current range. As mentioned above, the allowable current range is from 740 mA to 780 mA. In one embodiment, if the charging current value is 750 mA, then the procedure goes to S50. Otherwise, if the charging current value is 730 mA, then the procedure goes to S60.

In block S50, the displaying module 114 displays the test success information on the display device. As mentioned above, the displaying module 114 displays "SUCCESS" on the display device.

In block S60, the displaying module 114 displays the test failure information on the display device. As mentioned above, the displaying module 114 displays "FAIL" on the display device.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computing system for testing charging current of a mobile electronic device, the system comprising a storage system storing a plurality of programs and a processor that executes one or more operations for the plurality of programs, the programs comprising:
    a setting module operable to set a charging voltage value and a battery voltage value for the mobile electronic device;
    a sending module operable to send a control command to a power supply device to generate the charging voltage and the battery voltage according to the set charging voltage value and battery voltage value;
    a receiving module operable to receive a charging current value of the mobile electronic device from a current test device under the charging voltage and the battery voltage generated by the power supply device;
    a determining module operable to determine if the charging current value falls in an allowable current range; and
    a displaying module operable to display test success or failure information on a display device according to the determination result.

2. The system of claim 1, wherein the power supply device provides direct-current (DC) power to the current test device.

3. The system of claim 1, wherein the mobile electronic device is selected from the group consisting of a mobile phone, a personal digital assistant (PDA), a handheld game player, and a digital camera.

4. The system of claim 1, wherein displaying module displays test success information on the display device, in response to a determination that the charging current value falls in the allowable current range, and displays test failure information on the display device, in response to a determination that the charging current value does not fall in the allowable current range.

5. A computer-implemented method of testing charging current of a mobile electronic device, the method comprising:
    (a) setting a charging voltage value and a battery voltage value for the mobile electronic device;
    (b) sending a control command to a power supply device to generate the charging voltage and the battery voltage according to the set charging voltage value and battery voltage value;
    (c) receiving a charging current value of the mobile electronic device from a current test device under the charging voltage and the battery voltage generated by the power supply device;
    (d) determining if the charging current value falls in an allowable current range; and
    (e) displaying test success or failure information on a display device according to the determination result.

6. The method of claim 5, wherein the power supply device provides direct-current (DC) power to the current test device.

7. The method of claim 5, wherein the mobile electronic device is selected from the group consisting of a mobile phone, a personal digital assistant (PDA), a handheld game player, and a digital camera.

8. The method of claim 5, wherein the block (e) comprises:
    displaying test success information on the display device, in response to a determination that the charging current value falls in the allowable current range; and
    displaying test failure information on the display device, in response to a determination that the charging current value does not fall in the allowable current range.

9. A non-transitory storage medium having stored thereon instructions that, when executed by a computer, causes the computer to perform a method of testing charging current of a mobile electronic device, the method comprising:
    (a) setting a charging voltage value and a battery voltage value for the mobile electronic device;
    (b) sending a control command to a power supply device to generate the charging voltage and the battery voltage according to the set charging voltage value and battery voltage value;
    (c) receiving a charging current value of the mobile electronic device from a current test device under the charging voltage and the battery voltage generated by the power supply device;
    (d) determining if the charging current value falls in an allowable current range; and
    (e) displaying test success or failure information on a display device according to the determination result.

10. The non-transitory storage medium of claim 9, wherein the power supply device provides direct-current (DC) power to the current test device.

11. The non-transitory storage medium of claim 9, wherein the mobile electronic device is selected from the group consisting of a mobile phone, a personal digital assistant (PDA), a handheld game player, and a digital camera.

12. The non-transitory storage medium of claim 9, wherein the method of the block (e) comprises:
    displaying test success information on the display device, in response to a determination that the charging current value falls in the allowable current range; and
    displaying test success information on the display device, in response to a determination that the charging current value falls in the allowable current range.

* * * * *